United States Patent [19]
Grishakov et al.

[11] Patent Number: 5,644,547
[45] Date of Patent: Jul. 1, 1997

[54] MULTIPORT MEMORY CELL

[75] Inventors: Gennady Ivanovich Grishakov; Igor Vladimirovich Tarasov, both of Moscow, Russian Federation

[73] Assignee: Sun Microsystems, Inc., Mountain View, Calif.

[21] Appl. No.: 641,998

[22] Filed: Apr. 26, 1996

[51] Int. Cl.$^6$ ........................................................ G11C 7/00
[52] U.S. Cl. ........................ 365/230.05; 365/189.04; 365/221
[58] Field of Search ........................ 365/230.05, 221, 365/156, 189.04

[56] References Cited

U.S. PATENT DOCUMENTS

| | | | |
|---|---|---|---|
| 4,586,168 | 4/1986 | Adlhoch et al. | 365/189.04 |
| 4,914,630 | 4/1990 | Fujishima et al. | 365/189.04 |
| 5,062,081 | 10/1991 | Runaldue | 365/189.04 |

OTHER PUBLICATIONS

Jolly, et al., "A 9-ns 1.4-Gigabyte/s, 17-Ported CMOS Register File", IEEE Journal of Solid-State Circuits, vol. 26, No. 10 Oct. 1991.

*Primary Examiner*—David C. Nelms
*Assistant Examiner*—Michael T. Tran
*Attorney, Agent, or Firm*—D'Alessandro & Ritchie

[57] ABSTRACT

A multiport memory cell has a pair of switched reference ports; a pair of banks having at least one switched read/write port; a storage element for storing a small differential voltage between one of the switched reference ports and a corresponding one of the switched read/write ports during a write operation; and a pair of amplifying elements for precharging bit line capacitances and/or providing sufficient output current during simultaneous read operations. During a read operation, the storage element is switched-on and swings high or low depending on the small differential voltage stored during the previous write operation.

17 Claims, 3 Drawing Sheets

5,644,547

1

MULTIPORT MEMORY CELL

BACKGROUND OF THE INVENTION

1. Field of the Invention

The present invention relates to multiport memory cells. More particularly, the present invention relates to a multiport memory cell using a small differential voltage for write operation and a single addressable port for both read and write operation, and having read current amplification to precharge bit lines and to allow for simultaneous reads in case of address coincidence.

2. The Prior Art

Multiport CMOS memory cells are known in the art. Such memory cells permit sharing of memory by providing for a large number of ports for read and write operations. For example, one such multiport memory cell is discussed in the IEEE Journal of Solid-State Circuits, vol. 26, no. 10, October 1991. Such a multiport memory cell is shown in FIG. 1. It is a nine-ported memory cell and has associated read and write circuitry.

The nine-ported memory cell of this prior art memory cell uses common bit and word lines for read and write operations, so they are performed in succession. The memory cell can be connected to six bit lines through N-channel MOS pass transistors. This configuration provides six read ports (one bit line per port) and three write ports (two bit lines per port).

Despite the existence of the above multiport memory cell, there remains room for improvement in minimizing the voltage required for a write operation while ensuring cell stability and reliability of the multiport memory cell during a read operation.

Thus, it is an object of this invention to provide a multiport memory cell using a small differential voltage during write operations while ensuring nondestructive reads of the memory cell.

It is another object of this invention to provide a multiport memory cell using a single addressable pod for both read and write operation per storage node.

It is another object of this invention to provide a multiport memory cell that provides for precharging bit lines and for simultaneous read operations.

BRIEF DESCRIPTION OF THE INVENTION

According to one embodiment of the present invention, a multiport memory cell operates through a pair of switched reference ports; a pair of banks having at least one switched read/write port; and a storage element for storing a small differential voltage between one of the switched reference ports and a corresponding one of the switched read/write ports during a write operation. During a read operation, the storage element is switched-on and swings high or low depending on the small differential voltage stored during the previous write operation.

According to another embodiment of the present invention, the multiport memory cell may have a capacitance discharge circuit and a delay circuit. The delay circuit switches-off the capacitance discharge circuit after the discharge circuit discharges the storage element of the memory cell during a write operation.

According to yet another embodiment of the present invention, the multiport memory cell has a pair of switched read/write ports having first and second source followers,

2 respectively, that provide for precharging bit line capacitances of the first and second switched read/write ports and lines. According to various features of this embodiment, the first and second source followers provide for simultaneous reads of the storage element in case of address coincidence by amplifying the storage element's output current.

With regard to yet another feature of the present invention, the multiport memory cell may operate with at least one other multiport memory cell to create a multiport memory array. The memory cells each store a small differential voltage from their corresponding one first and second switched reference ports and corresponding first and second bank of a plurality of switched read/write ports during a write operation. During a read operation the storage elements of each memory cell swing high or low in response to the small differential voltage stored during a previous write operation.

Still another important feature of the invention involves the use of the multiport memory cell with other devices that require the writing, storing and reading of a data signal.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 2:
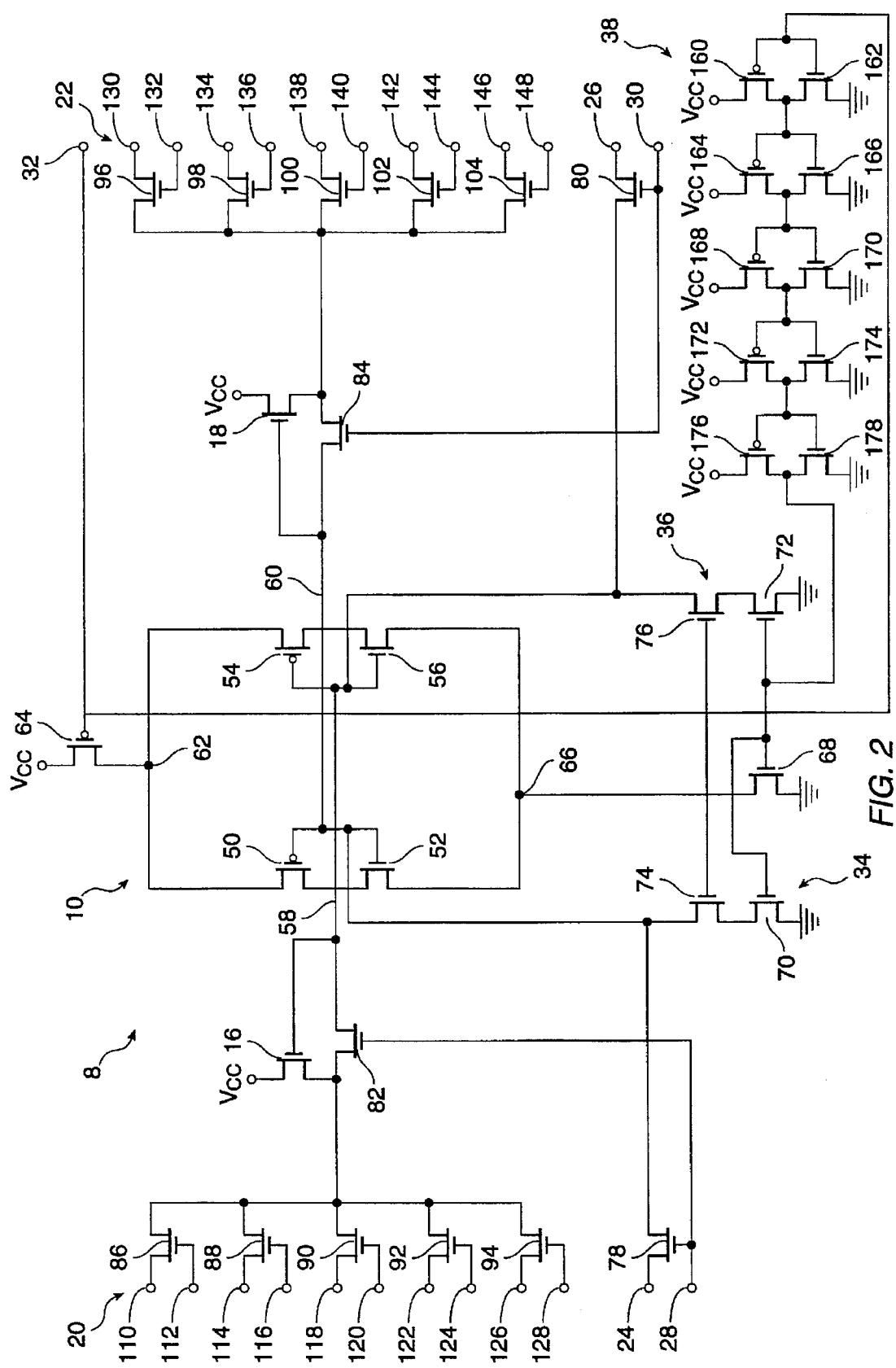
FIG. 2 is a schematic diagram of a multiport memory cell according to one embodiment of the present invention.

FIG. 2 is a schematic diagram of a multiport memory cell according to a first embodiment of the present invention. The multiport memory cell storage element 8 has a cross-coupled inverters ("flip-flop") 10; first and second "bank of a plurality of switched read/write ports" 20 and 22 having source followers 16 and 18, respectively; first and second "switched reference ports" 24 and 26; first and second "write" ports 28 and 30; and a "write enable" port 32. Note that in this embodiment, the flip-flop is coupled to first and second capacitance "discharge circuits" 34 and 36 that are driven by a delay circuit 38.

As shown in FIG. 2, the multiport memory cell storage element 8 has a cross-coupled pair of inverters. The first inverter has a P-channel MOS transistor 50 and a N-channel MOS transistor 52 having their gates connected together and their drains connected together, the drains connecting to a first bit line 58. The second inverter has a P-channel MOS transistor 54 and a N-channel MOS transistor 56 having their gates connected together and their drains connected together, the drains connecting to a second bit line 60. The cross coupling is provided by connecting the gates of transistors 50 and 52 to the second bit line 60 and connecting the gates of transistors 54 and 56 to the first bit line 58.

The sources of P-channel MOS transistors 50 and 54 are connected together to a first supply voltage node 62. The first supply voltage node 62 is a switched node and is connected to a switching transistor, such as the drain of a P-channel MOS transistor 64 as shown in FIG. 2. The P-channel MOS transistor 64 has a source connected to a first power rail potential such as 5 volts and a gate connected to write enable port 32, the gates of switching N-channel MOS transistors 74 and 76 that comprise part of first and second discharge circuits 34 and 36, respectively, and the input of delay circuit 38.

The sources of N-channel MOS transistors 52 and 56 are connected together to a second supply voltage node 66. The second supply voltage node 66 is a switched node and is connected to a switching transistor, such as the drain of an N-channel MOS transistor 68 as shown. The gate of the N-channel MOS transistor 68 is connected to the gates of switching transistors, such as the gates of N-channel MOS transistors 70 and 72 as shown in FIG. 2, that comprise part of discharge circuits 34 and 36, respectively. In addition, the gates of the N-channel MOS transistors 68, 70, and 72 are connected to the output of a delay circuit 38 having an odd number of minimal inverters. In this embodiment of the present invention, there are five minimal inverters defining delay circuit 38.

First and second discharge circuits 34 and 36 each have a pair of switching transistors connected in series. In this embodiment, first discharge circuit 34 has a N-channel MOS transistor 70 having a drain connected to the source of N-channel MOS transistor 74 and a source connected to a second power rail potential such as Ground. The N-channel MOS transistor 74 has a drain connected to the source of first N-channel MOS transistor 78 and to second bit line 60. First N-channel MOS transistor 78 has a gate connected to first write port 28 and the gate of third N-channel MOS transistor 82. Third N-channel MOS transistor 82 has a drain connected to the source of N-channel MOS transistor 16 and to each drain of each N-channel MOS transistor 86, 88, 90, 92, and 94 that define first addressable read/write port 20. Third N-channel MOS transistor 82 also has a source connected to the gate of N-channel MOS transistor 16 and to first bit line 58.

Similarly, second discharge circuit 36 has a N-channel MOS transistor 72 having a drain connected to the source of N-channel MOS transistor 76 and a source connected to the second power rail potential such as Ground. The N-channel MOS transistor 76 has a drain connected to the source of second N-channel MOS transistor 80 and to first bit line 58. Second N-channel MOS transistor 80 has a gate connected to second write port 30 and a drain connected to second reference port 26. Fourth N-channel MOS transistor 84 has a source connected to the source of N-channel MOS transistor 18 and to each drain of each N-channel MOS transistor 96, 98, 100, 102, and 104 that define second addressable read/write port 22. Fourth N-channel MOS transistor 84 also has a source connected to the gate of N-channel MOS transistor 18 and to second bit line 60.

The N-channel MOS transistors 86, 88, 90, 92, and 94 define first switched read/write port 20. The N-channel MOS transistors 86, 88, 90, 92, and 94 have gates connected to address lines 112, 116, 120, 124, and 128, respectively, and have sources connected to bit lines 110, 114, 118, 122, and 126, respectively.

Similarly, N-channel MOS transistors 96, 98, 100, 102, and 104 define second switched read/write port 22. The N-channel MOS transistors 96, 98, 100, 102, and 104 have gates connected to address lines 132, 136, 140, 144, and 148, respectively, and have sources connected to bit lines 110, 114, 118, 122, and 126, respectively.

Delay circuit 38 has five minimal inverters connected in series, as shown at the lower part of FIG. 2. The first inverter has a P-channel MOS transistor 160 and a N-channel MOS transistor 162 having their gates connected together—the gates connected to the gates of N-channel MOS transistors 74 and 76, the gate of P-channel MOS transistor 64, and write enable port 32; and their drains connected together—the drains connected to both gates of a second inverter. The second inverter has a P-channel MOS transistor 164 and a N-channel MOS transistor 166 having their gates connected together and their drains connected together, the drains connected to both gates of a third inverter. The third inverter has a P-channel MOS transistor 168 and a N-channel MOS transistor 170 having their gates connected together and their drains connected together, the drains connected to both gates of a fourth inverter. The fourth inverter has a P-channel. MOS transistor 172 and a N-channel MOS transistor 174 having their gates connected together and their drains connected together, the drains connected to both gates of a fifth inverter. The fifth inverter has a P-channel MOS transistor 176 and a N-channel MOS transistor 178 having their gates connected together and their drains connected together, the drains connected to the gates of N-channel MOS transistors 68, 70, and 72.

All of the P-channel MOS transistors that belong to the above five inverters have sources connected to the first power rail potential. All of the N-channel MOS transistors that belong to the above five inverters have sources connected to the second power rail potential.

During "read operation," only address inputs are actively used. A low level signal having a potential such as Ground is fed to first and second write ports 28 and 30 and to write enable port 32. This switches off N-channel MOS transistors 74, 76, 78, 80, 82, and 84; and switches on P-channel MOS transistor 64 and N-channel MOS transistors 68, 70, and 72. This connects the flip-flop through P-channel MOS transistor 64 and first supply voltage node 62 and to a second supply voltage node 66 and N-channel MOS transistor 68.

The data stored by the flip-flop (at first and second bit lines 58 and 60) are read by N-channel transistors 16 and 18. N-channel transistors 16 and 18 are source followers and provide for sufficient output current to precharge bit line capacitances by having gates of sufficient size as compared to all other multiport memory cell transistors.

In one embodiment of the present invention, the N-channel transistors 16 and 18 may be used with priority circuits (not shown) to permit simultaneous reading of the flip-flop through some or all of the bit ports belonging to first and second addressable read/write ports 20 and 22 since transistors 16 and 18 can be sized to meet the required output current to allow for the reading of some or all of the bit ports in case of address coincidence. The priority circuits are attached between the output of an address decoder and the input address lines of the first and second read/write ports 20 and 22.

During "write operation," write enable port 32 and either the first read/write port 20 and the first write port 28 or the second read/write port 22 and the second write port 30 are actively used. It is desirable to feed positive edges of these signals during precharge of bit and reference lines.

The positive edge of the write enable signal triggers the following: First, it isolates the flip-flop from the first supply voltage, i.e., it turns-off the flip-flop and triggers the delay circuit 38. Second, the flip-flop including its first and second bit nodes begins to discharge any held capacitances through first and second discharge circuits 34 and 36 since N-channel MOS transistors 74 and 76 are switched-on by the positive edge of the write enable signal. At this point N-channel MOS transistors 68, 70, and 72 are switched on. Last, after a certain delay the delay circuit completely propagates the enable signal by outputing a low signal thereby switching-off first and second discharge circuits 34 and 36 by switching-off N-channel MOS transistors 70 and 72 and disconnecting the second voltage supply node from the second power rail potential by turning off N-channel MOS transistor 68.

The delay circuit 38 sets the required discharge time interval for the flip-flop after receiving the positive edge of the write enable signal from write enable port 32. The discharged time is based on the time it takes for the write enable signal to propagate through the delay circuit inverters. When the minimally sized and odd numbered inverter delay circuit 38 propagates the write enable signal and outputs an inverted signal that is sufficient to switch on N-channel transistors 68, 72, and 74, the storage element is ready to be connected to a select bit and reference line.

Applying a write signal having a positive pulse edge at first write port 28 switches on N-channel transistors 78 and 82. Or, alternatively, if the write signal is applied to the second write port 30, N-channel transistors 80 and 84 are switched on. The switching on of transistor 82 or 84 switches off source followers 16 or 18, respectively.

The small voltage differential between a selected bit port and a corresponding reference port 24 or 26 is then passed to bit lines 58 and 60. For example, with a write signal having a positive edge at first write port 28 and a reference voltage at reference port 24 enables a selected address port such as 112 to "write" to bit lines 58 and 60. The differential voltage required between a selected bit and reference port for a write is "small" and is within 0.3 and 0.5 volts. The write operation is terminated by switching off the write circuits by sending a negative pulse edge to the active first or second write port 28 or 30. The bit and reference lines are then precharged to prepare for the next read operation.

As discussed above, the flip-flop is switched-on during the read operation. The flip-flop swings high or low depending on the small differential voltage sensed at the first and second bit nodes as provided by the reference and bit line voltages during the previous write operation.

Those reasonably skilled in the art will recognize that in the interval between precharge pulses of bit and reference lines the voltages on a selected bit port and on a reference port are generated by a data driver and a reference driver.

Note that in another embodiment of the present invention, the flip-flop may be discharged through first and second addressable read/write ports 20 and 22 avoiding the need for the discharge transistors 68, 70, 72, 74, and 76. However, this approach will cause some changes of the bit and reference port voltages that in a worst case scenario may reduce the differential signal when the information is written to the cell and result in less reliability of the cell value.

Figure 3:
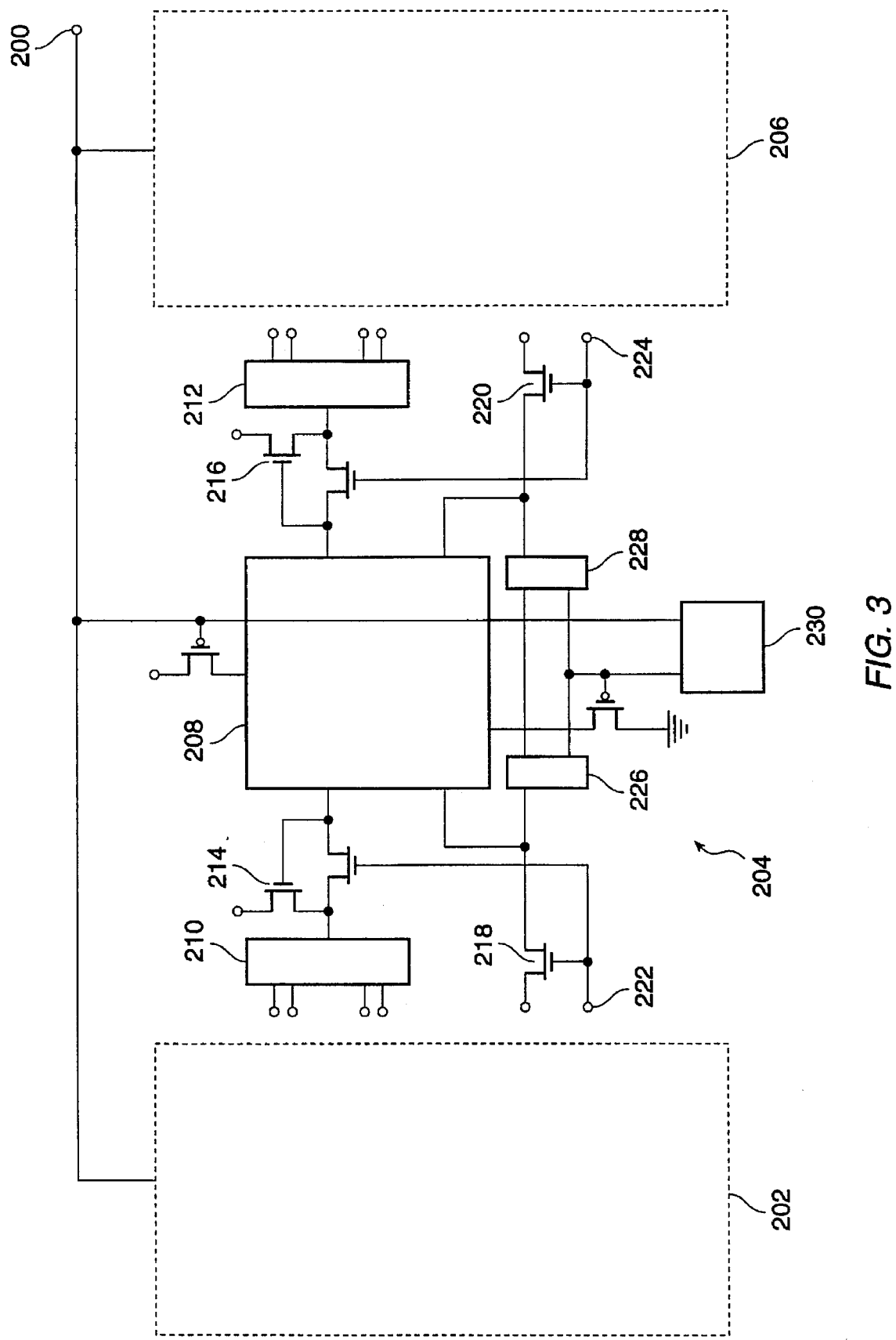
FIG. 3 is a schematic diagram of a plurality of multiport memory cells using a small voltage swing for write operation according to a second embodiment of the present invention.

FIG. 3 shows another embodiment of the present invention. FIG. 3 shows a write enable port 200 connected to three (3) multiport memory cells 202, 204, and 206 defining a multiport memory cell array. Multiport memory cells 202 and 206 are shown in block form to avoid complicating FIG. 3 and are intended to be identical to the embodiment of the present invention as described in FIG. 2 and as shown (in a high level block diagram) by multiport memory cell 204 in FIG. 3.

Figure 1:
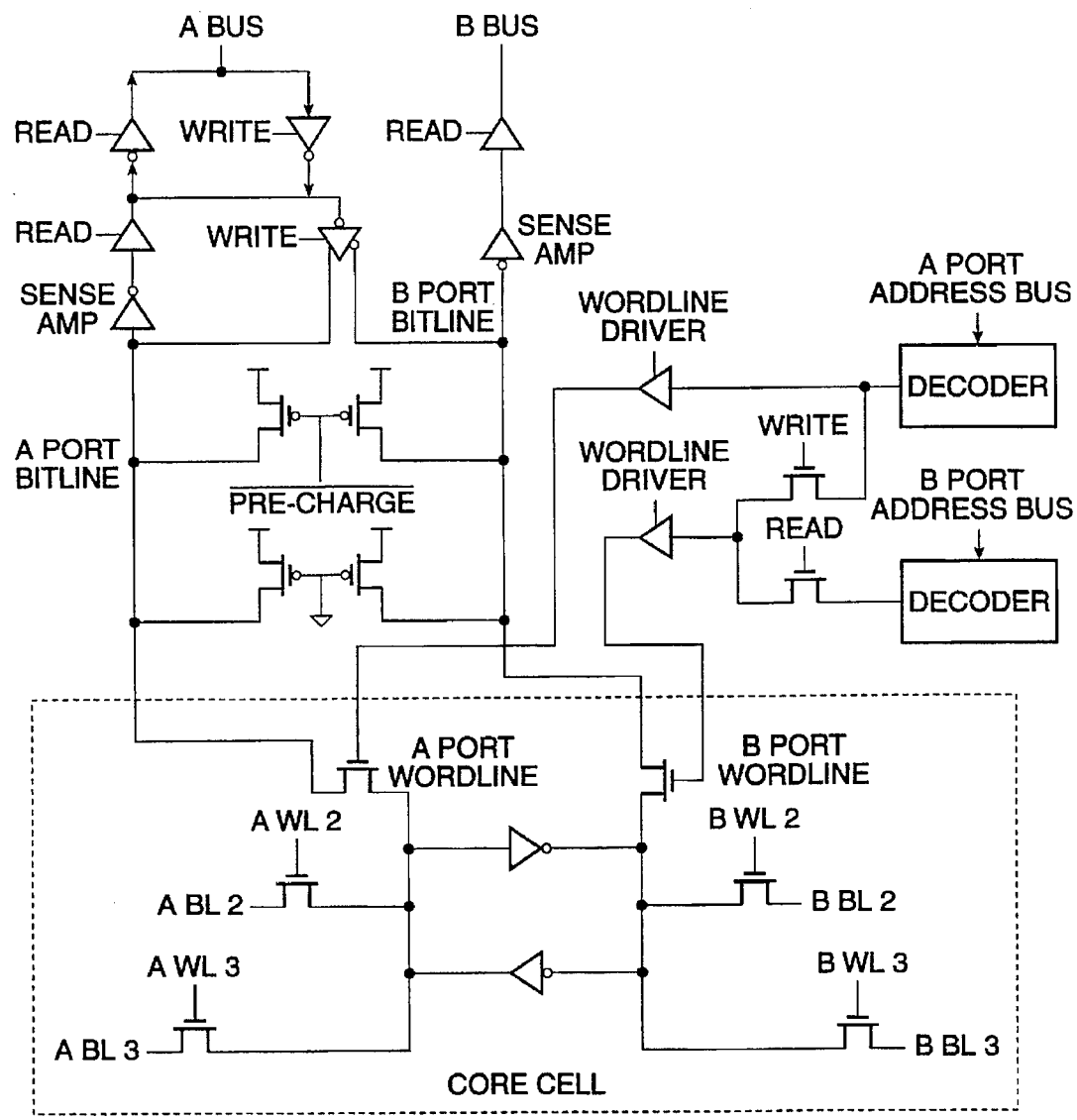
FIG. 1 is a schematic diagram of the prior art for a multiport memory cell.
Figure 4:
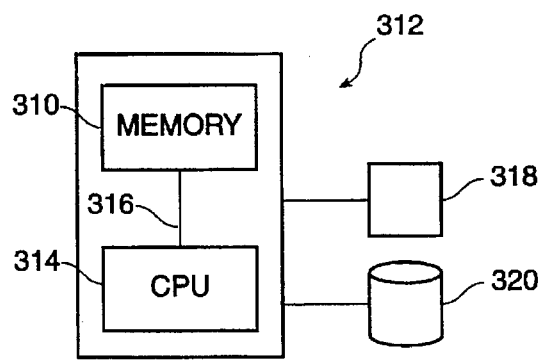
FIG. 4 is a schematic diagram of a typical use of a memory cell.

Multiport memory cell 204 has a cross-coupled storage element 208; a first and second bank of a plurality of switched read/write ports 210 and 212 having source followers 214 and 216, respectively; first and second switched reference ports 218 and 220; and first and second write ports 222 and 224; and a write enable port 200. FIG. 3 also shows the multiport memory cell 204 connected to a first and second discharge circuit 226 and 228 that are driven by a delay circuit 230. The MOS transistors shown are similar to and operate like the MOS transistors in the discussion above pertaining to FIG. 2. Also, those reasonably skilled in the art will recognize that the array size does not have to be limited to an array of three but can be any number of multiport memory cells needed as seen in FIG. 4, the memory cell array discussed above is typicaly used as memory 310 for a computer system 312 having a processor such as a Central Processing Unit ("CPU") 314 and a bus 316 coupling the memory 310 to the CPU 314, a video monitor 318, and disk storage 320, as known in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A multiport memory cell comprising:
   a first and second switched reference port;
   a first and second bank of a plurality of switched read/write ports;
   a storage element for storing a small differential voltage between about 0.3 and about 0.5 volts between one of said switched reference ports and a corresponding one of said switched read/write ports during a write operation, wherein during a read operation said storage element swings high or low depending on the value of said small differential voltage stored during a previous write operation.

2. A multiport memory cell according to claim 1 further comprising:
   at least one discharge circuit coupled to said storage element; and
   a delay circuit coupled to said discharge circuit, wherein said delay circuit switches-off said discharge circuit after said discharge circuit discharges said storage element during a write operation.

3. A multiport memory cell according to claim 2 wherein:
   said storage element is coupled to a first bit line and a second bit line; and
   said at least one discharge circuit including a first discharge circuit coupled to said first bit line and a second discharge circuit coupled to said second bit line.

4. A multiport memory cell according to claim 3, wherein said storage element includes cross-coupled first and second inverters, said first bit line coupled to the output of said first inverter and to the input of the second inverter, and said second bit line coupled to the input of the first inverter and to the output of the second inverter.

5. A multiport memory cell according to claim 4, further including a first and second switching circuit, each of said switching circuit for providing a voltage potential to said storage element, said first switching circuit has an input coupled to a write enable port, and said second switching circuit has an input coupled to an output of a delay circuit.

6. A multiport memory cell according to claim 1, wherein said first and second switched read/write ports are coupled to first and second source followers, respectively, that provide for precharging bit line capacitances of said first and second switched read/write ports.

7. A multiport memory cell according to claim 6 wherein said first and second source followers provide for simultaneous read operations of said storage element in case of address coincidence.

8. A multiport memory cell according to claim 1 further comprising:

a plurality of said first and second switched reference ports;

a plurality of said first and second bank of a plurality of switched read/write ports; and a plurality of said storage elements, wherein each of said storage elements store a small differential voltage from a corresponding one of said plurality of first and second switched reference ports and from a corresponding one of said plurality of said first and second bank of a plurality of switched read/write ports during a write operation, wherein during a read operation said plurality of storage elements swing high or low in response to said small differential voltage stored during a previous write operation.

9. The multiport memory cell according to claim 8, further comprising:

a CPU; and one or more data buses, wherein one of said data buses connects said CPU with the multiport memory cell.

10. A multiport memory cell according to claim 1, further comprising:

a first amplifier coupled between said first bank of a plurality of switched read/write ports and said storage element; and a second amplifier coupled between said second bank of a plurality of switched read/write ports and said storage element.

11. A method of operating a multiport memory cell comprising the steps of:

powering-off and disconnecting a storage element from a first power rail potential;

discharging said storage element;

writing to said storage element by storing a small differential voltage between about 0.3 and about 0.5 volts in said storage element after discharge, said small differential voltage based on the voltages on a selected bit line and on a selected reference port;

reading said storage element by powering-on said storage element to trigger said storage element to swing high or low depending on said stored small differential voltage.

12. A multiport memory cell according to claim 11, wherein said step of discharging includes triggering a delay circuit and using the end of the delay period of said delay circuit to determine the discharge period of said discharging step.

13. A method of providing a computer system, comprising the steps of:

providing an array of multiport memory cells, wherein each of said multiport memory cells including:

a first and second switched reference port;

a first and second bank of a plurality of switched read/write ports;

a storage element for storing a small differential voltage between one of said reference ports and a corresponding one of said read/write ports during a write operation, wherein during a read operation said storage element swings high or low in response to said small differential voltage stored during a previous write operation.

14. A method of providing a computer system, according to claim 13, wherein each of said provided multiport memory cells of said array further including:

a plurality of said first and second switched reference ports;

a plurality of said first and second bank of a plurality of switched read/write ports; and a plurality of said storage elements, wherein each of said storage elements store a small differential voltage from a corresponding one of said plurality of first and second switched reference ports and from a corresponding one of said plurality of said first and second bank of a plurality of switched read/write ports during a write operation, wherein said plurality of storage elements amplify said small differential voltage during a read operation in case of address coincidence.

15. A multiport memory cell comprising:

a first and second switched reference port, said first switched reference port connecting to the drain of a first N-channel MOS transistor, and said second switched reference port connecting to the drain of a second N-channel MOS transistor;

a first and second write port, said first write port connecting to the gate of said first N-channel MOS transistor of said first switched reference port and to the gate of a third N-channel MOS transistor, and said second write port connecting to the gate of said second N-channel MOS transistor of said second switched reference port and to the gate of a fourth N-channel MOS transistor;

a first and second power rail potential;

a first and second bit line;

a first and second source follower, said first source follower having a N-channel MOS transistor with a source connected to said first power rail potential, a drain and gate connected to the source and drain of said third N-channel MOS transistor, respectively, wherein said gate of said source follower N-channel MOS transistor also connecting to said first bit line, said second source follower having a N-channel MOS transistor with a source connected to said first power rail potential, a drain and gate connected to the source and drain of said fourth N-channel MOS transistor, respectively, wherein said gate of said source follower N-channel MOS transistor also connecting to said second bit line;

a first and second bank of a plurality of switched read/write ports, each port connecting to a source of a N-channel MOS transistor with a gate connecting to an address port and a drain connecting to the drain of N-channel MOS transistor of said first and second source follower, respectively, and to the source of said third and fourth N-channel MOS transistors, respectively;

a first and second supply voltage node; and a storage element having cross-coupled first and second inverters, said first inverter having a P-channel MOS transistor having a source connecting to said first supply voltage node, a gate connecting to a gate of a N-channel MOS transistor and said second bit line of said second inverter, and a drain connecting to a drain of said N-channel MOS transistor forming said first bit line, said N-channel MOS transistor having a source connecting to said second supply voltage node, said second inverter having a P-channel MOS transistor having a source connecting to said first supply voltage node, a gate connecting to a gate of a N-channel MOS transistor and said first bit line of said first inverter, and a drain connecting to a drain of a N-channel MOS transistor forming said second bit line, said N-channel MOS transistor having a source connecting to said second supply voltage node; and a first and second switching circuit for providing a voltage potential to said first and second supply voltage node, respectively, wherein a P-channel MOS transistor having a drain connected to said first power supply rail potential, a gate connected to a write enable port, and a source connected to said first supply voltage node defines said first switching circuit.

16. A multiport memory cell according to claim 10 further comprising:

a first and second discharge circuit each discharge circuit having a top and bottom N-channel MOS transistor, wherein said top N-channel MOS transistor of said first discharge circuit has a drain connecting to the source of said first MOS transistor of said first write port and said first bit line, a gate connecting to the gate of said top N-channel MOS transistor of said second discharge circuit; and a source connecting to a drain of said bottom N-channel MOS transistor of said first discharge circuit, said bottom N-channel MOS transistor of said first discharge circuit has a gate connecting to the gate of the N-channel MOS transistor of said second switching circuit, the gate of said bottom N-channel MOS transistor of said second discharge circuit, and a source connecting to said second power rail potential, wherein said top N-channel MOS transistor of said second discharge circuit has a drain connecting to said second MOS transistor of said second write port and said second bit line and a source connecting to the drain of said bottom N-channel MOS transistor of said second discharge circuit, said bottom N-channel MOS transistor of said second discharge circuit has a source connecting to said second power rail potential;

a delay circuit having first, second, third, fourth, and fifth inverters connected in series, wherein said first inverter has a P-channel MOS transistor with a source connecting to said first power rail potential, a gate connecting to a gate of a N-channel MOS transistor forming a first inverter input node, and a drain connecting to a drain of said N-channel MOS transistor forming a first inverter output node, said N-channel MOS transistor has a source connecting to said second power rail potential, said first inverter input node connecting to the gates of said of top N-channel MOS transistors of said first and second discharge circuit, to the gate of a P-channel MOS transistor of said first switching circuit, and to said write enable port, wherein said second inverter has a P-channel MOS transistor with a source connecting to said first power rail potential, a gate connecting to a gate of a N-channel MOS transistor and to said first inverter output node, and a drain connecting to a drain of said N-channel MOS transistor forming a second inverter output node, said N-channel MOS transistor has a source connecting to said second power rail potential, wherein said third inverter has a P-channel MOS transistor with a source connecting to said first power rail potential, a gate connecting to a gate of a N-channel MOS transistor and to said second inverter output node, and a drain connecting to a drain of said N-channel MOS transistor forming a third inverter output node, said N-channel MOS transistor has a source connecting to said second power rail potential, wherein said fourth inverter has a P-channel MOS transistor with a source connecting to said first power rail potential, a gate connecting to a gate of a N-channel MOS transistor and to said third inverter output node, and a drain connecting to a drain of said N-channel MOS transistor forming a fourth inverter output node, said N-channel MOS transistor has a source connecting to said second power rail potential, wherein said fifth inverter has a P-channel MOS transistor with a source connecting to said first power rail potential, a gate connecting to a gate of a N-channel MOS transistor and to said fourth inverter output node, and a drain connecting to a drain of said N-channel MOS transistor forming a firth inverter output node, said N-channel MOS transistor has a source connecting to said second power rail potential, wherein said firth inverter output node connecting to the gates of N-channel MOS transistors of said second switching circuit, and said bottom N-channel MOS transistors of said first and second discharge circuit.

17. A multiport memory cell comprising:

a first and second switched reference port;

a first and second bank of a plurality of switched read/write ports;

a storage element for storing a small differential voltage between about 0.3 and about 0.5 volts between one of said switched reference ports and a corresponding one of said switched read/write ports during a write operation, wherein during a read operation said storage element swings high or low depending on the value of a small differential voltage stored during a previous write operation; and a first and second switching circuit coupled to said storage element, said first and second switching circuit for providing a first and second voltage potential to said storage element during said read operation, respectively, and said first switching circuit for switching-off said first voltage potential from said storage element during said write operation.

* * * * *

UNITED STATES PATENT AND TRADEMARK OFFICE
CERTIFICATE OF CORRECTION

PATENT NO. : 5,644,547
DATED : July 1, 1997
INVENTOR(S) : Gennady I. Grishakov and Igor V. Tarasov It is certified that error appears in the above-indentified patent and that said Letters Patent is hereby corrected as shown below:

Column 5, line 14: replace "discharged time" with --discharge time--.

Column 6, line 12: replace "needed as" with --needed. As--.

Column 9, line 14: replace "claim 10 further" with --claim 15 further--.

Column 10, line 28: replace "firth" with --fifth--.

Column 10, line 30: replace "firth" with --fifth--.

Signed and Sealed this

Eighteenth Day of November 1997

*Attest:*

BRUCE LEHMAN

*Attesting Officer*  Commissioner of Patents and Trademarks